United States Patent [19]

Joshi et al.

[11] Patent Number: 5,543,182
[45] Date of Patent: Aug. 6, 1996

[54] SELF-ACCELERATING AND REPLENISHING NON-FORMALDEHYDE IMMERSION COATING METHOD

[75] Inventors: Nayan Joshi, East Brunswick; John E. McCaskie, Whitehouse Station, both of N.J.; Michael T. Boyle, Holland, Pa.

[73] Assignee: Atotech USA, Inc., Somerset, N.J.

[21] Appl. No.: 389,565

[22] Filed: Feb. 16, 1995

Related U.S. Application Data

[63] Continuation of Ser. No. 121,455, Sep. 16, 1993, abandoned, which is a continuation-in-part of Ser. No. 34,485, Mar. 18, 1993, abandoned.

[51] Int. Cl.$^6$ ........................................ B05D 1/18
[52] U.S. Cl. .................. 427/443.1; 205/125; 205/126
[58] Field of Search ..................... 106/1.05, 1.22, 106/1.23; 205/126, 169, 187; 427/98, 445.1

[56] References Cited

U.S. PATENT DOCUMENTS

| | | | |
|---|---|---|---|
| Re. 29,015 | 10/1976 | De Angelo et al. | 430/319 |
| 3,011,920 | 12/1961 | Shipley | 117/213 |
| 3,099,608 | 7/1963 | Radovsky et al. | 205/123 |
| 3,340,164 | 9/1967 | Zimmerman | 205/159 |
| 3,682,671 | 8/1972 | Zablisky | 106/286 |
| 3,682,786 | 8/1972 | Brown et al. | 205/50 |
| 3,748,109 | 7/1973 | Lee | 29/195 |
| 3,793,038 | 2/1974 | Maguire | 427/943.1 |
| 3,817,774 | 6/1974 | Kuzmik | 428/463 |
| 3,874,882 | 4/1975 | Gulla et al. | 106/1.11 |
| 3,904,792 | 9/1975 | Gulla et al. | 427/304 |
| 3,962,497 | 6/1976 | Doty et al. | 427/306 |
| 3,984,290 | 10/1976 | Kitaev et al. | 205/85 |
| 4,035,227 | 7/1977 | Doty et al. | 216/83 |
| 4,229,218 | 10/1980 | Gulla et al. | 106/1.23 |
| 4,279,948 | 7/1981 | Kukanskis | 427/305 |
| 4,311,551 | 1/1982 | Sykes | 156/640 |
| 4,517,254 | 5/1985 | Grapentin | 428/626 |
| 4,525,390 | 6/1985 | Alpaugh et al. | 427/305 |
| 4,617,205 | 10/1986 | Darken | 427/305 |
| 4,639,380 | 1/1987 | Amelio et al. | 427/97 |
| 4,683,036 | 7/1987 | Morrissey et al. | 205/125 |
| 4,725,314 | 2/1988 | Gulla et al. | 106/1.11 |
| 4,751,106 | 6/1988 | Wilkinson | 427/98 |
| 4,810,333 | 3/1989 | Gulla et al. | 205/125 |
| 4,818,286 | 4/1989 | Jagannathan | 106/1.23 |
| 4,863,758 | 9/1989 | Rhodenizer | 427/97 |
| 4,895,739 | 1/1990 | Bladon | 427/304 |
| 4,919,768 | 4/1990 | Bladon | 205/125 |
| 4,931,148 | 6/1990 | Kukanskis et al. | 205/126 |
| 4,956,014 | 9/1990 | Kondo et al. | 106/1.23 |
| 5,015,339 | 5/1991 | Pendleton | 205/125 |
| 5,071,517 | 12/1991 | Oabayashi | 205/12 |
| 5,202,151 | 4/1993 | Ushio | 427/98 |
| 5,213,841 | 5/1993 | Gulla et al. | 427/98 |
| 5,376,248 | 12/1994 | Conrod | 204/164 |

FOREIGN PATENT DOCUMENTS

| | | |
|---|---|---|
| 0530568A2 | 3/1993 | European Pat. Off. |
| 0538006A1 | 4/1993 | European Pat. Off. |
| WO93/00456 | 1/1993 | WIPO. |

OTHER PUBLICATIONS

Harnden, E., "A System For Direct Plating" (presented Mar. 19, 1992 TechCon '92, North East Circuits Association).
Darken, Dr. J., et al., "A New Direct Plating System For Circuit Board Production" (presented Sep., 1992, ISFEC92).
Nakahara, Dr. Hayao, PC FAB, 16–19 (Oct., 1992) Direct Metallization Technology, Part I.
*Printed Circuits Handbook*, Clyde F. Coombs, Jr., Ed., McGraw Hill, New York (1967).

*Primary Examiner*—John Niebling
*Assistant Examiner*—Brendan Mee
*Attorney, Agent, or Firm*—Finnegan, Henderson, Farabow, Garrett and Dunner

[57] ABSTRACT

A process for applying a metal coating to a non-conductive substrate without an electroless coating is disclosed. The process includes the step of: a. contacting said substrate with an activator comprising a noble metal/Group IVA metal sol to obtain a treated substrate; b. contacting said treated substrate with a self accelerating and replenishing immersion metal composition comprising a solution of (i) a soluble metal salt whose metal is more noble than said Group IVA metal, (ii) a Group IA metal hydroxide, (iii) a complexing agent comprising an organic material having a cumulative formation constant log K of from about 0.73 to about 21.95 for an ion of the metal of said metal salt. The Group IVA metal is employed in a stoichiometric excess compared to the noble metal, the excess Group IVA metal being in its lowest oxidation state. Self accelerating and replenishing non-formaldehyde immersion metal compositions are also disclosed. The composition is used in a two step process to electrolytically coat a nonconductive substrate. In the first step the conductivity of the substrate is increased by applying the composition to it. In the second step, the substrate treated with the composition is electrolytically coated with a metal.

75 Claims, No Drawings

SELF-ACCELERATING AND REPLENISHING NON-FORMALDEHYDE IMMERSION COATING METHOD

This application is a continuation of application Ser. No. 08/121,455, filed Sep. 16, 1993, now abandoned, which is a continuation-in-part of Ser. No. 08/034,485, filed Mar. 18, 1993, now abandoned.

BACKGROUND OF THE INVENTION

1. Field of the Invention

The field of the invention is the electrometallization of non-metallic substrates without using an electroless metal coating. In one embodiment, the invention relates to circuit boards and a method for improving the manufacture of such boards by eliminating electroless plating of the boards and effecting through-hole plating and/or directly forming circuits thereon by an electrolytically deposited metal coating. A novel coating process and composition are disclosed for this process.

2. Discussion of the Related Art

Many processes are known for the formation of metal coatings on non-metallic substrates either for decorative or functional purposes. One of the more commercially important uses of such coatings is in the manufacture of printed circuit boards. Printed circuit boards (PCB's) comprise, for example, a rigid non-conducting or dielectric base made up of a fibrous material such as glass fibers, paper and the like in combination with a polymer such as an epoxy resin, and a conductive metal layer such as copper on either one or both surfaces. Multilayer boards (MLB's) comprise several PCB's laminated to one another by means of an adhesive. In addition to rigid boards (as described above), flexible boards can be produced employing thermoplastic dielectric layers such as fluorocarbon polymers, Nylon polymers, polyimides, Kevlar™ reinforced polymers, polyparabanic acids and polyesters. Flexible boards are manufactured without fiber reinforcing. Production of both of these types of printed circuit boards are described in *Printed Circuits Handbook*, Second Edition, edited by C. F. Coombs, Jr., McGraw-Hill, 1979, which is incorporated herein by reference. Laminated combinations of flexible and rigid boards are also finding utility in some applications for MLB's.

In the manufacture of PCB's, a metal conductive foil such as copper is bonded to the circuit board, although any metal may be applied to a non-conductive dielectric circuit board as a foil or by electro deposition or electroless deposition.

Prior to laminating inner layers to form an MLB, the metal surface is treated in an art known manner to produce electrically conductive lines (circuits) for the transfer of current between components of an electric circuit, the components comprising by way of example diodes, transistors, resistors, capacitors and the like. The circuits may be formed either by a positive or a negative working photoresist, silk screen resist or hand painted resist process followed by etching and in some instances, electrodeposition of a metal or metals, all of which is known in the art.

In forming MLB's by laminating, an adhesive in the form of a prepreg is inserted between the surfaces of the PCB's that are to be laminated, after which the multilayers are further treated by application of heat and pressure. The prepreg generally comprises a woven or non-woven layer or layers of fibers such as glass, cellulose (e.g., paper), and the like, glass being preferred. The prepreg also is impregnated with a so-called "B-stage" resin such as an epoxy resin that has been partially cured. Art known equivalents of epoxy resins are also employed as adhesives such as acrylic resins (used with polyimide circuit boards) or polyester resins.

In MLB's, the circuit of one board is connected to the circuit of one or more of the other boards in the multilayers. This is done by forming pads or circular areas of metal at a point or points on the conductive line or lines of the board. The pads may also be isolated from the conductive lines. The other board or boards that are to be connected are similarly provided with pads and in the laminating process the pads of the different boards are aligned over one another.

The MLB is then pressed and cured after which the pads of the inner layers are drilled to form through-holes. The diameter of the drill is considerably less than the diameter of the pad, the ratio of diameters of the pad to the drill being about 2:1 or greater, so that the overall structure comprises at a minimum, a pad from one board aligned over a pad from another board, with a through-hole passing through them. Since the through-hole in cross-section ideally presents a surface of alternating layers of the pads of the individual PCB's separated by the non-conductive base, an electrically conductive element has to be employed in the hole to form an electrical connection between the pads. This is done by a process known in the art as through-hole plating (PTH).

PTH processes are also employed for connecting two metal conductive surfaces having a single non-conductive or dielectric board interposed therebetween for the formation of a PCB. Double sided boards of this type and the formation of through-holes in such boards are to be considered as falling within the scope of the present invention and are intended to be included within the broad definition of a PCB as that term is used throughout the written description of the present specification.

Before the PTH process can be undertaken, any "smear" in the hole must be removed. Smearing is encountered when the drill bit employed to form the hole through the aligned pads in an MLB picks up resinous material from the hole and deposits this material on the wall of the hole during the drilling process. Since the wall of the hole contains alternating resinous material layers and metal layers, the surface of the metal layers that form part of the hole wall will be coated with the resinous material thereby preventing any metallic plating material applied to the surface of the hole wall from contacting the metal layers and forming an electrically conductive connection with it. It is believed that the resinous material such as a B-stage epoxy resin used in the prepreg comprises the principle material involved in the smearing of the hole. Smearing, therefore, renders the PTH process ineffective.

The problem of smearing is overcome by chemical cleaning in which a strong mineral acid such as sulfuric acid (optionally followed by hydrofluoric acid) is used in an "etch-back" process to away the "smear" from the wall of the hole. Hydrofluoric acid is used to remove any glass fiber ends that might be projecting into the hole. The glass fiber ends come from the glass fiber employed in the manufacture of the circuit boards or prepreg and are removed since they cause imperfections in the surface of the metallic coating applied by the PTH process and can cause conductivity failures in the hole.

The etch-back process requires very careful control in order to prevent excessive etching of the wall of the hole. The concentration and temperature of the etching solution has to be monitored as well as the length of time over which the etching process is conducted.

After smear is removed, the through-hole is plated. Prior art methods comprise the application of electroless copper as a PTH plating material. Standard electroless copper plating solutions known in the art are used for this purpose. Prior to applying the electroless copper, and in order to promote its deposition on the non-conductive surface, the non-conductive surface is treated with a two step activator comprising a stannous chloride sensitizer solution followed by a sensitizer solution of divalent palladium chloride according to the process of Bergstrom et al., U.S. Pat. No. 2,702,253. The stannous chloride is oxidized to stannic chloride and the palladium chloride reduced to palladium metal on the uncoated portions of the board. The palladium, however, when in contact with the copper cladding of the circuit board, forms a palladium immersion coating on the copper since palladium is more noble than copper and displaces it. This can result in an inordinate consumption of palladium in the process.

A more preferred method for preparing the activator is described by Shipley, Jr., U.S. Pat. No. 3,011,920 which employs an activator comprising a noble metal dispersion e.g., a colloidal palladium dispersion, containing stannic tin. Stannic and/or stannous tin forms a protective colloid around the metallic palladium, and the dispersion implants a precious metal site on the non-conductive surface for the purpose of initiating the deposition of the copper by chemical reduction. This process substantially eliminates the problems of forming immersion palladium coatings on the copper surface of the copper-clad boards. A post activator is then employed, generally an acid, to solubilize the protective colloid and expose the noble metal, i.e., palladium.

The subsequently applied electroless copper coating solution contains cupric ions and a reducing agent such as formaldehyde, which reduces the cupric ions in the solution to copper metal when in the presence of palladium, which acts as a catalyst for the reduction. The copper metal plates out on the surface of the through-hole, making electrical contact with the walls of the metal pads through which the hole is drilled as well as the copper surface on the outer and inner layer(s) of the MLB. The electroless copper may have subsequent metal coatings applied to it by electrolytic means.

The stability and plating characteristics of electroless copper are controlled to a large degree by additives known collectively as stabilizers or rate controllers. Because these additives require a fine balance in the plating bath under various production conditions, the electroless copper process is difficult to control precisely so that consistent results are obtained. This balance is obtained by conducting regular analyses of the components of the electroless bath as well as continuous or periodic addition of the various additives. Temperature control of the bath is also required as well as continuous filtration and aeration. The plating tank and bath filter have to be cleaned regularly and regular plating rate determinations have to be made as well.

Significantly, environmental problems have to be addressed when employing electroless copper, such as removal of the complexing agents employed in the bath from waste-water streams, removal of the metal from the bath prior to disposal of the spent bath, monitoring COD levels in waste-water, reducing such levels and lastly, exposure of operators and the environment to formaldehyde which is a carcinogen. The latter is an especially significant problem.

Various processes and compositions have been developed to avoid the use of electroless copper plating for many of the above reasons. Elimination of the electroless copper coating could also amount to significant cost savings in the production of metallized non-conductive materials such as circuit boards.

One of the systems used to avoid electroless coatings was based on conductive ink technology which relies on the physical deposition of a fine layer of carbon in the through-holes and over the entire board surface.

However, carbon deposits on the metal surface of a circuit board interfere with the adhesion of copper or other metals that are subsequently electroplated onto the base copper and accordingly, the carbon had to be removed by an etching step prior to electroplating. It was difficult to control this etching step and the carbon in the through-holes also had to be protected. For these reasons, the carbon process had only limited commercial acceptance.

Another solution to the problem was the employment of conductive polymers, whereby the circuit board or other non-metallic substrate is immersed in a strong hot permanganate solution to produce manganese dioxide on the substrate, such as the epoxy surfaces of a MLB. When the board thus treated is contacted with a suitable monomer, the conductive polymer is formed on those areas on which the manganese dioxide is formed. One of the advantages of employing this process is there is little conductive polymer deposited on the copper surface of the circuit board. Some difficulties are presented, however, in that glass or other resins such as polyimides and polytetrafluoroethylene are not readily coated by this process. In addition, there are problems encountered in controlling polymer layer thicknesses and monomer instability, as well as some environmental problems. The monomers are generally hazardous substances and, because of their volatility, will escape into the atmosphere and polymerize to form a black film on other areas of the circuit board and the coating equipment.

Radovsky et al., U.S. Pat. No. 3,099,608, assigned to IBM, discloses a process in the early 1960's for the direct metallization of non-conductive non-metallic substrates by a system using a "conductivator" metal such as palladium in colloidal or semi-colloidal form. By very carefully controlling the process, Radovsky et al. found that it was possible to build enough potential across the through-hole portion of a two-sided board to induce copper deposition. Although the process proved to be of little commercial value, several subsequent processes were based on the Radovsky et al. discovery.

For example, Holtzman et al., U.S. Pat. No. 4,891,069 discovered that if the palladium colloid was stabilized with a water soluble salt such as aluminum chloride, the palladium would act to combine with hydrogen that was generated electrolytically and this hydrogen could be employed to reduce a subsequently or simultaneously applied aqueous solution of a copper salt thereby eliminating electroless copper.

At about the same time, Morrissey et al., U.S. Pat. No. 4,683,036 developed the "EE-1" system in which the electroless coating process was also eliminated. In the EE-1 system, palladium "islands" are formed in the through-holes and plated by a special copper bath that contains an inhibitor which generally can be described as a surfactant, chelating agent, brightener or levelling agent.

Although the EE-1 process has some promise as a commercially viable method, it is not especially suitable in pattern plate applications since panel plating is required while the panels are still wet from the catalyzing step. Additionally, the EE-1 process is not especially suitable for effectively plating high aspect ratio multi-layer boards.

Several so-called sulfide conversion coatings can also be employed to electroplate non-conductive substrates without the application of an electroless metal coating such as those described by Bladon, U.S. Pat. Nos. 4,895,739 and 4,919,768, in which a catalytic metal chalcogenide is formed on a non-metallic substrate by applying a tin-noble metal electroless catalyst to the substrate and subsequently treating the substrate with a solution containing a dissolved sulfide to form a sulfide of the noble metal. An electrolytic metal coating is then applied to the substrate.

Gulla et al., U.S. Pat. No. 4,810,333 also describes the application of a transition metal sulfide to a non-metallic substrate adjacent to and in contact with conductive areas on the substrate after which electrolytic plating can be conducted over the sulfide formed. A permanganate solution is given as an example of one of the transition metal compounds that can be employed in the process and is used to form a manganese oxide coating on the substrate. This manganese coating is subsequently converted to a sulfide by means of a metal thiocarbamate solution.

The conductivity of the sulfide conversion coating, as well as the conductive polymers described previously is generally low. Accordingly, it is difficult to avoid what is known in the art as "dog-boning" as plating builds up near the through-hole entrances and in the case of small holes, closing the hole before plating has reached through the center of the hole. Long plating times are also encountered employing either one of these systems and this can contribute to excessive "pink-ring" formation.

Okabayashi, U.S. Pat. No. 5,071,517, assigned to Solution Technology Systems, describes a method for the direct electroplating of a non-conducting substrate where the substrate is first treated with a non-acidic aqueous salt solution containing a micro-fine colloidal dispersion of a noble or precious metal and tin to form a strongly adsorbed, uniform conducting layer upon at least a portion of the substrate. The conducting layer is then electroplated directly. Okabayashi describes the use of an aldehyde such as lignin vanillin and notes that it is utilized to form the micro-fine palladium/tin catalyst. According to the invention, electroless plating systems, conversion coatings or preferential plating solution additives are avoided.

Harnden, in a paper presented at Northeast Circuits Association Technical Conference, Mar. 19, 1992, further describes the Solution Technology Systems catalyst as being easier to process control than electroless copper, noting that the uniformity and fineness of the catalysts are augmented by the use of a food grade aldehyde. Harnden goes on to state that with normal processing, the adsorbed catalyst does not provide enough conductivity to allow processing small holes or high aspect ratios, but by using a special alkaline accelerator, a continuous and highly conductive catalyst film is produced which is easily removed from the copper surfaces of a circuit board by micro-etching. It is further noted by the author that in order to achieve optimal conductivity after the boards are immersed in a warm solution of the tin-palladium colloid catalyst, they are immersed in a mild alkaline bath which also contains a small amount of copper ions which deposit on and between the tin-palladium particles.

Kitaev et al., U.S. Pat. No. 3,984,290 describes a PTH process in which a film is formed by immersing a MLB into a solution containing ions of a metal which is more electropositive than the metal of the metal layers. The film obtained has a monolithic structure in the dielectric zones of the through-hole and a porous structure in the metal zones. Examples of solutions containing ions of a metal which is more electropositive than the metal of the MLB metal layers include silver salt/ammonium hydroxide solutions; palladium copper-salt/sulfuric acid solutions and palladium salt/hydrochloric acid solutions. Prior to immersion of the MLB into one of these solutions, the structure is preferably treated with a conventional sensitizer such as those containing ions of divalent tin or trivalent titanium.

SUMMARY OF THE INVENTION

Accordingly, an advantage of the present invention is to provide a process and composition for the electrolytic plating of a non-metallic substrate without the application of an electroless coating to the substrate and one that substantially obviates one or more of the limitations and disadvantages of the related art.

It is a further advantage of the present invention to provide a novel self accelerating and replenishing formaldehyde free immersion metal coating process and composition for subsequent electrolytically plating a non-metallic substrate without employing an electroless metal coating.

A further advantage of the invention is that it does not employ a formaldehyde containing coating composition and thereby avoids the various health and environmental problems associated with the use of formaldehyde.

The specific advantages and other advantages of the invention will be realized and attained by the process and composition of matter particularly pointed out in the written description and claims hereof.

To achieve these and other objects and advantages and in accordance with the purpose of the invention, as embodied and broadly described herein, the invention comprises a process for applying a metal conducting film to a non-conductive substrate without an electroless coating comprising:

(a) contacting the substrate with an activator comprising a noble metal-Group IVA metal sol to obtain a treated substrate;

(b) contacting the treated substrate with a self accelerating and replenishing immersion metal composition comprising a solution of;
  (i) a soluble metal salt whose metal is more noble than said Group IVA metal;
  (ii) a Group IA metal hydroxide;
  (iii) a complexing agent comprising an organic material having a cumulative formation constant log K from about 0.73 to about 21.95 for an ion of the metal of said metal salt.

An especially preferred activator comprises a palladium-tin sol where the Group IB metal comprises copper. Complexing agents that are especially suitable for the purpose of the invention comprise an aliphatic and aromatic amines and amino acids, gluconic acid, lactic acid, or acetic acid, tartaric acid and their salts and especially monoethanol amine. A preferred alkaline metal hydroxide comprises lithium hydroxide.

The invention also relates to a novel composition of matter comprising the aforesaid self accelerating and replenishing immersion metal composition.

After the self accelerating and replenishing immersion metal composition has been applied to the substrate, an electrolytic metal coating composition can be applied to the substrate such as an electrolytic copper composition. It has also been found that prior to the application of the electrolytic coating, that the self accelerating and replenishing immersion metal composition on the substrate is advantageously prepared for the electrolytic metal coating by microetching with a conventional acid type microetch composition. Prior to the microetch, however, the substrate treated with the self accelerating and replenishing immersion composition is contacted with a neutralizing and reducing composition comprising an acid and a salt of an inorganic or organic amine, the salts in one embodiment comprising salts of hydroxylamine or hydrazine and the acid comprising a mineral acid. The substrate once treated with the neutralizing and reducing solution is then microetched and electrolytically coated. A circuit may be provided on the substrate such as a microcircuit which is produced on the substrate in a conventional manner.

Unlike the direct electroplating methods of the related art, the present invention is directed to a two step process in which the conductivity of the substrate is increased by means of the self accelerating and replenishing immersion metal composition after which the treated substrate is electrolytically coated with a metal. The present invention advantageously avoids the use of an electroless metal coating an avoids the health and environmental problems associated with the formaldehyde contained in electroless coating compositions.

It is to be understood that both the foregoing general description and the following detailed description are exemplary and explanatory and are intended to provide further explanation of the invention as claimed.

DETAILED DESCRIPTION

It has been found according to the present invention that non-conductive polymers or metal-clad dielectric substrates such as copper clad substrates can be electroplated directly by a process sequence which includes contacting the substrate with a conditioner, followed by an activator and then a novel self accelerating and replenishing non-formaldehyde immersion metal composition such as a copper coating solution followed by a neutralizer. This treatment makes such non-conductive substrates sufficiently electrically conductive for direct electroplating.

The various non-conductive substrates such as the MLB structures previously described herein or any coated or uncoated circuit board may be treated according to the process of the present invention as well as other non-conductive substrates such as polymeric substrates, ceramic substrates or other metal oxide non-conductive substrates and also the substrates generally and specifically described by Lee in U.S. Pat. No. 3,748,109, which is incorporated herein by reference.

In one embodiment of the invention, copper-clad laminates with through-holes are employed as printed circuit board substrates.

The substrates are first treated with a cleaner conditioner such as M & T Harshaw Connect Conditioner™ followed by appropriate rinses. This pretreatment of the board promotes the adsorption of the activating material to the substrate.

The substrate is optionally micro-etched with a chemical etchant, where the substrate comprises a non-conductive material having a metal layer on it such as a copper-clad substrate which is employed in the manufacture of circuit boards. Examples of such a chemical etchant includes M & T Harshaw, B.D. Micro Etch™ and others which are commercially available for this purpose. The micro-etching step is employed in order to prepare the metal layer such as the copper layer portion of the substrate for subsequent electroplating. Acid dips and water rinses may be included after etching.

Prior to treating the substrate with an activator, it may be immersed in a commercial pre-dip containing NaCl, $SnCl_2$ and HCl, the pH of which is below about 0.5.

The substrate is then treated with an activator comprising a noble metal/Group IVA metal sol. Noble metals comprise Ag or Au or Group VIII noble metals including Ru, Rh, Pd, Os, Ir, Pt, or various mixtures of such noble metals. The preferred noble metals are the Group VIII noble metals and especially a metal comprising palladium.

The activator of the present invention is prepared in such a fashion so that there is excess Group IVA metal compound reducing agent present, i.e., a stoichiometric excess of reducing agent (e.g., divalent tin) compared to the noble metal compound (e.g., divalent Pd) from which the activator is made. In this way the activator such as the Pd/Sn sol has residual divalent Sn that can function as a reducing agent.

The Group IVA metals that may be employed include, for example, Ge, Sn and Pb, or mixtures thereof Sn being preferred.

The activator preferably will contain a stoichiometric excess of the Group IVA metal as compared to the noble metal. The Group IVA metal is substantially in its lowest oxidation state so that it will be available to reduce the more noble metal salts that are employed in forming the activator. Because it is also employed in a stoichiometric excess based on the salts of the noble metal that are employed to form the activator, the excess of the Group IVA metal in combination with the activator will also be substantially in its lowest oxidation state. The activator thus prepared with the excess of the Group IVA metal in its lowest oxidation state will also be available to reduce the Group IB or other more noble metal salts that are subsequently brought into contact with the activator, such as the salts of copper as described herein. The Group IVA metal is preferably employed as a salt, such as a halide and especially a chloride, but in any event, will be present in an amount so that the molar ratio of the Group IVA metal to the noble metal of the activator is from about 4:1 to about 95:1, especially about 10:1 to about 55:1 and preferably from about 15:1 to about 50:1. Some specific Group IVA metal salts that may be used in this regard comprise PbCl2, $SnCl_2$ or a mixture of $GeCl_2$ and $GeCl_4$ dissolved in dilute hydrochloric acid. The preferred Group IVA metal comprises tin and especially tin in the form of stannous chloride.

The preparation of the activator is conventional and is disclosed by Shipley, U.S. Pat. No. 3,011,920 and Zeblisky, U.S. Pat. No. 3,682,671, both of which are incorporated herein by reference.

The treated substrate, after the activator solution has been applied, is rinsed and then treated with a self accelerating and replenishing immersion metal bath. The self accelerating and replenishing immersion-bath contains a metal salt, the metal of which is more noble, i.e., has a higher standard reduction potential in the electrochemical series, than the Group IVA metal. Examples of these salts are soluble Ni salts, especially water soluble nickel salts or Group IB soluble metal salts, especially water soluble Group IB metal salts where the Group IB metal comprises Cu, Ag, Au or mixtures thereof with each other or nickel salts. In one embodiment, the preferred Group IB metal salts comprise copper salts. Anywhere from about 0.0002 to about 0.2 mols/l and especially from about 0.004 to about 0.01 mols/l of the more noble metal salt may be employed in the bath where the solvent preferably comprises water.

Although the inventors do not wish to be limited by any theory, it is believed that the process of the invention proceeds by way of an immersion coating reaction whereby the more noble metal salts e.g., Group IB metal or nickel salts in solution (i.e., those metals having a higher standard reduction potential in the electrochemical series) displaces the Group IVA metal composition protective colloid in that the Group IVA metals are less noble (i.e., have a relatively lower standard reduction potential in the electrochemical series). This is borne out to some degree by the rise in concentration of Group IVA metal compounds in the process bath. Thus, for example, where the activator comprises a palladium/tin sol prepared by reduction of a palladium chloride solution by stannous chloride, colloidal palladium is formed in combination with a stannous chloride protective colloid. Where the self accelerating and replenishing immersion metal composition comprises a copper salt such as cupric chloride, tin which is less noble than copper will be oxidized into solution whereas the copper in reduced form will attach itself to the various palladium sites on the non-conductive substrate. It is this formation of the reduced copper on the non-metallic substrates that provides conductivity on the substrate.

The bath includes a Group IA metal hydroxide in an amount from about 0.1 to about 3.5 mols/l and especially from about 0.3 to about 1.5 mols/l. The Group IA metals in this regard comprise Li, Na, K, Rb, Cs or mixtures thereof, especially Li, Na, K and mixtures thereof and preferably a metal comprising Li. The pH of the bath is adjusted with the Group IA alkali metal hydroxide so that the bath is alkaline, especially above about 11, such as from about 11.5 to about 13.0.

Lastly, the self accelerating and replenishing immersion metal composition includes a complexing agent including an organic material having a cumulative formation constant log K of from about 0.73 to about 21.95 for an ion of said Group IB metal or nickel and is present in an amount from about 0.05 to about 1.0 mols/l and especially from about 0.2 to about 0.5 mols/l. The cumulative formation constant log K values are especially the log $K_1$, log $K_3$, log $K_4$, log $K_f$ [ML] or log $K_f$ [MHL] constants.

Generally the complexing agent is employed in an amount sufficient so that the bath can perform as a self accelerating and replenishing immersion metal bath and form a thin, dense metal-rich catalytic film on the substrate with sufficient electrical conductivity for subsequent electroplating and at the same time produce relatively clean metal surfaces. This is extremely important for the subsequent electroplating of the surface.

The complexing agent is also selected so that the coating bath will be self accelerating and replenishing when the substrate is clad or coated with a metal that is also employed to coat the bare dielectric substrate such as copper. The complexing agent in this respect will be capable of reacting with the metal as the metal salt is depleted from the bath so that the new metal complex will in turn be employed for coating the bare dielectric substrate that has been treated with the activator.

These organic complexing agents that may be used are generally described in Lange's *Handbook of Chemistry*, Edited by J. Dean, 12th Edition, and listed in the tables entitled "Cumulative Formation Constants For Metal Complexes with Organic Ligands" as follows:

| Temperature is 25° C. and ionic strengths are approaching zero unless otherwise indicated: (a) at 20° C., (c) 0.1M uni-univalent salt (d) 1.0M uni-univalent salt. | |
|---|---|
| | Log K |
| Acetate | |
| Ag (I) | 0.73 |
| Cu (II) a | 2.16 |
| NI (II) | 1.12 |
| Acetylacetone | |
| Cu (II) | 8.27 |
| Ni (II) a | 6.06 |
| Citric Acid | |
| Ag | 7.1 |
| Cu (II) | 4.35 |
| Ni | 5.11 |
| 1,2-Diaminocyclohexane-N,N,N',N'-tetraacetic acid | |
| Cu (II) c | 21.95 |
| Ni c | 19.4 |
| Dimethylglyoxime (50% dioxane) | |
| Cu (II) | 12.00 |
| Ni | 11.16 |
| 2,2'-Dipyridyl | |
| Ag | 3.65 |
| Cu (II) | 8.0 |
| Ni | 6.80 |
| Ethanolamine | |
| Ag | 3.29 |
| Cu (II) | 6.68 |
| Ethylenediamine | |
| Cu (II) | 10.67 |
| Ni | 7.52 |
| Ethylenediamine N,N,N',N'-tetraacetic acid | |
| Ag | 7.32 |
| Cu (II) | 18.7 |
| Ni | 18.56 |
| Glycine | |
| Ag | 3.41 |
| Cu (II) | 8.60 |
| Ni | 6.18 |
| N'-(2-Hydroxyethyl)ethylenediamine-N,N,N'-triacetic acid | |
| Cu (II) c | 17.40 |
| Ni c | 17.0 |
| 8-Hydroxy-2-methylquinoline (50% dioxane) | |
| Cu (II) | 12.48 |
| Ni | 9.41 |
| 8-Hydroxyquinoline-5-sulfonic acid | |
| Cu (II) | 11.92 |
| Ni | 9.57 |
| Lactic acid | |
| Cu (II) | 3.02 |
| Ni | 2.22 |
| Nitrilotriacetic acid | |
| Cu (II) c | 13.10 |

Temperature is 25° C. and ionic strengths are approaching zero unless otherwise indicated: (a) at 20° C., (c) 0.1M uni-univalent salt (d) 1.0M uni-univalent salt.

| | Log K |
|---|---|
| Ni | 11.26 |
| 1-Nitroso-2-naphthol (75% dioxane) | |
| Ag | 7.74 |
| Cu (II) | 12.52 |
| Ni | 10.75 |
| Oxalate | |
| Ag | 2.41 |
| Cu (II) | 6.16 |
| Ni | 5.3 |
| 1,10-Phenanthroline | |
| Ag | 5.02 |
| Cu (II) | 9.08 |
| Ni | 8.80 |
| Phthalic acid | |
| Cu (II) | 3.46 |
| Ni | 2.14 |
| Piperidine | |
| Ag | 3.30 |
| Propylene-1,2-diamine | |
| Cu (II) c | 6.41 |
| Ni d | 7.43 |
| Pyridine | |
| Ag | 1.97 |
| Cu (II) | 2.59 |
| Pyridine-2,6-dicarboxylic acid | |
| Cu (II) a, d | 9.14 |
| Ni a,d | 6.95 |
| 1-(2-Pyridylazo)-2-naphthol (PAN) | |
| Cu (II) | 16 |
| Ni | 12.7 |
| 4-(2-Pyridylazo)resorcinal (PAR) | |
| Cu (II) | 10.3 |
| Ni | 13.2 |
| Pyrocatechol-3,5-disulfonate | |
| Cu (II) | 16.47 |
| Ni | 9.35 |
| 8-Quinolinol | |
| Cu (II) | 12.2 |
| Ni (50% dioxane) | 11.44 |
| Salicylic acid | |
| Cu (II) | 10.60 |
| Ni | 6.95 |
| Succinic acid | |
| Cu (II) | 3.33 |
| Ni | 2.36 |
| 5-Sulfosalicylic acid | |
| Cu (II) c | 9.52 |
| Ni c | 6.42 |
| Tartaric acid | |
| Cu (II) | 3.2 |
| Thioglycolic acid | |
| Ni | 6.98 |
| Thiourea | |
| Ag | 7.4 |
| Cu (I) | 13 |

Temperature is 25° C. and ionic strengths are approaching zero unless otherwise indicated: (a) at 20° C., (c) 0.1M uni-univalent salt (d) 1.0M uni-univalent salt.

| | Log K |
|---|---|
| Triethanolamine | |
| Ag | 2.30 |
| Cu (II) | 4.30 |
| Ni | 2.7 |
| Triethylenetetramine (Trien) | |
| Ag | 7.7 |
| Cu (II) | 20.4 |
| Ni | 14.0 |
| 1,1,1-Trifluoro-3-2'-Thenoylacetone (TTA) | |
| Ni | 10.0 |

The preferred complexing agent for copper ions is an alkanolamine comprising for example monoethanolamine. Alkanolamines in addition to monoethanolamine that may be employed in this regard include the following lower alkanolamines:

diethanolamine;

triethanolamine;

monoisopropanolamine;

diisopropanolamine;

triisopropanolamine;

mono-sec-butanolamine;

di-sec-butanolamine;

2-amino-2-methyl-1-propanediol;

2-amino-2-ethyl-1,3-propanediol;

2-dimethylamino-2-methyl-1-propanol;

tris(hydroxymethyl)aminomethane; and various mixtures of the alkanolamines.

Other weak complexing agents can be used such as other amines, including aliphatic and cyclic e.g., aromatic amines having up to about 10 carbon atoms all of which are described in Kirk-Othmer *Encyclopedia of Chemical Technology* under "Amines" which is incorporated herein by reference. Additionally, mono and poly carboxylic acids having up to about 8 carbon atoms and their salts can be used and include amino acids. These acids are also defined in Kirk-Othmer, Id. under "Carboxylic Acids" and "Amino Acids" which is incorporated herein by reference. The preferred acids in this regard include gluconic acid, lactic acid, acetic The various anions of the Group IB water soluble salt include inorganic acid anions or mixtures thereof such as the halogen anions, ions, i.e., $F^-$, $Cl^-$, $Br^-$ or $I^-$, $Cl^-$ being especially preferred, sulfate or carbonate anions, lower molecular weight organic acid anions such as formate or acetate anions or salicylate anions and the like. Additionally, mixtures of the foregoing anions can be employed as well as salt-like anions such as a Group IB halide alkali metal halide salts e.g., $CuCl_2 2KCl.2H_2O$, $CuCl_2 2NaCl.2H_2O$ and the various art known equivalents thereof.

A preferred self accelerating and replenishing immersion copper bath comprises about 4 to about 60 g/l lithium hydroxide, about 10 to about 30 g/l monoethanolamine and about 0.2 to about 1.5 g/l cupric chloride. After contacting with the activator, the substrates are subjected to the self accelerating and replenishing immersion metal bath, for example, about 10 minutes with the temperature above about 140° F. Bath temperature may vary from about 120° to about 180° F. Treatment time ranges from about 4 to about 12 minutes or more which is typical for production purposes however, may vary out of this range depending on the temperature and condition of the bath. The time used is actually the time necessary to provide the best metal coverage for the formation of the conductive film or to provide minimum required coverage. The conductive film is then electrolytically coated by methods well known in the art.

Subsequent electroplating of the self accelerating and replenishing immersion metal coating of the present invention is best achieved if the coating is microetched in an acidic oxidizing medium so that the adhesion and morphology of the electrolytically applied metal coating (e.g., copper) is optimized. Microetching is effected by an acidic oxidizing agent which is conventional in the art, however, it has been found that even short exposures (e.g., about one-half minute) of the self accelerating and replenishing immersion metal coating of the present invention to the microetch solution causes a loss in conductivity and if microetching is carried out over a period of time for about two minutes the coating loses substantially all of its conductivity which indicates it is most likely entirely removed from the substrate.

Accordingly, after the substrate has been treated with the immersion coating e.g., the immersion copper bath, it is then preferably rinsed with water and subjected to a neutralization and reducing bath to eliminate this problem. The neutralization and reducing bath neutralizes the residual alkali on the treated surfaces and also improves the resistance of the conductive film to oxidizing chemical microetchants.

The neutralization and reducing steps may be conducted separately, i.e., in separate steps employing a first acid neutralization bath and a second reducing bath.

Reducing agents that may be employed in this regard are generally disclosed in U.S. Pat. No. 4,005,051, incorporated herein by reference, and include, for example, lower alkylamino boranes such as dimethylamino borane; alkali metal borohydrides such as sodium, potassium, or lithium borohydride, and especially sodium borohydride; alkali metal sulfites; sodium hypophosphite; ascorbic acid; iso-ascorbic acid; formic acid; salts of these acids; formaldehyde; and hydrazine or hydrazine compounds such as hydrazinehydrate. Other hydrazine compounds may be employed such as benzyl hydrazine; 1,1-dimethylhydrazine; 1,2 -dimethylhydrazine; 1,2-dimethylhydrazine dihydrochloride; ethylhydrazine; methylhydrazine; (2-nitrophenyl)hydrazine; phenylhydrazine hydrochloride; iso-propylhydrazine and hydrazo diformic acid.

Hydroxylamines or salts thereof may also be used as reducing agents including both α- or β-hydroxylamines such as the α- or β-lower alkyl hydroxylamines (where lower alkyl, includes 1 to about 5 carbon atoms, alkyl including both the straight chain alkyl groups and isomers thereof), such as α- or β-methylhydroxylamine; α- or β-ethylhydroxylamine; or α- or β-arylhydroxylamines where aryl is phenyl, benzyl or naphthyl, and may be substituted by one or more lower alkyl groups and includes α- or β-phenylhydroxylamine and the like.

An acidic neutralizing and reducing solution is especially preferred in this regard and comprises an acid in combination with a salt of an organic or inorganic nitrogen compound such as the sulfate, acetate, bromide, fluogermanate, fluesilicate, formate, hydrochloride, iodide, nitrate or orthophosphate of hydroxylamine. Hydrazine salts may also be employed such as the sulfate, fluogermanate, fluesilicate, formate, dihydrochloride, monohydrochloride, hydroiodide, dinitrate, mononitrate, oxalate, hypophosphate, orthophosphate, orthophosphite, selenate or tartarate of hydrazine. Mixtures of the foregoing salts can also be employed. Preferred compounds comprise hydroxylamine sulfate and hydrazine sulfate. Organic amine salts can also be employed, including the salts of aliphatic and heterocyclic amines as well as aromatic amines, diarylamines, diaminotoluenes, methylenedianiline, and phenylenediamines and derivatives thereof all of which are described in Kirk-Othmer, *Concise Encyclopedia of Chemical Terminology*, pp 82–87, which is incorporated herein by reference. The foregoing reducing agents may also be employed separately where the process is conducted as a two-step process comprising a first step of acidic neutralizing and a second step of reducing the coating on the substrate.

The acids that may be employed may comprise the mineral acids, i.e., the sulfur, nitrogen, phosphorus and halogen acids as well as the lower molecular weight organic acids e.g. those having up to about 8 carbon atoms including both monocarboxylic and polycarboxylic aliphatic and cyclic acids and mixtures of acids in a solvent such as water. Sulfuric acid is preferred. Anywhere from about 0.05 to about 1.5 m/l of acid may be employed in the neutralizing and reducing solution whereas the salt will be employed in an amount from about 0.1 to about 1.0 m/l and especially from about 0.2 to about 0.4 m/l and are dissolved in an appropriate solvent such as water. A preferred neutralizing solution comprises 2% (0.2 molar) $H_2SO_4$ and 5% (0.3 molar) of hydroxylamine sulfate, the balance being water.

The reduced substrate thus obtained and treated with an acidic oxidizing microetch solution substantially retains its conductivity. i.e., the conductivity after treatment with the neutralizing reducing solution followed by a microetch treatment showed no more than about 10% loss in conductivity whereas the substrate which was not subjected to the reducing treatment in some instances lost approximately 100% of the conductivity measured prior to the microetch step.

The treated substrate is then rinsed and air dried for dry film application PCB pattern plating. Pattern plating of the circuit board can be effected by applying a resist or pattern for the substrate that is coated with the self accelerating and replenishing immersion metal coating of the present invention either before or after contact with the neutralizing reducing composition or after the electrolytic coating is applied, all of which is carried out in accord with procedures known in the art using conventional pattern forming techniques such as photoresist, silk screen or ion-beam patterning processes. Alternatively, the silk screen or photoresist can be applied to the substrate before the self accelerating and replenishing immersion metal coating is put on the substrate and the resist removed before or after the coating is contacted by the neutralizing-reducing composition and/ or the microetch oxidizing treatment. The patterned self accelerating and replenishing immersion metal coating can then be coated electrolytically with a metal coating, again by methods well known in the art.

In one commercial embodiment, the resist is applied after the electrolytic metal coating such as a copper coating is applied to the substrate, a resist is then placed over the electrolytic copper and where applicable, the through holes plugged or covered by a tent process (i.e., the resist is employed in such a manner so as to extend over the tops and bottoms of the through holes and is not removed in the developing process) after which the resist is developed to form a pattern. A metal, such as copper is electrolytically applied to form a pattern and an etch resist such as tin placed on the patterned metal. The photoresist is then removed and the metallic areas which are not coated with tin are etched so as to leave a circuit.

The treated substrate can also be subjected to an electroplating bath in the case of PCB panel plating or plating on plastics or non-conductive polymers.

The application of the self accelerating and replenishing immersion coating of the present invention to the substrates as defined herein therefore comprises the first step in a two-step process for the application of a metal coating to a non-metallic substrate. In this first step, the self accelerating and replenishing immersion metal coating provides a coating on the surface of the substrate with significantly lowers resistance, i.e., the resistivity of the substrate is decreased to about 0.1 to about 30 k$\Omega$/in. and especially from about 2.0 to about 15 k$\Omega$/in. as compared to the conductivity of the substrate prior to the application of the self accelerating and replenishing immersion bath which is zero (no conductivity). After the application of the self accelerating and replenishing immersion metal bath, the substrate is coated electrolytically with the metal coating and the conductivity is increased significantly. Where the electrolytically coated substrate is to be employed in circuit applications, the conductivity is sufficiently high to meet industry standards in this respect.

The present invention is unlike the direct electroplating processes described for example by Morrissey and Holtzman where a palladium/tin coloid activator is applied to the substrate and subsequently electroplated directly, using electrolytic baths that have been modified for this purpose. By contrast, the present invention is directed to a two-step process wherein the conductivity is increased initially with the self accelerating and replenishing immersion metal coating after which in the second step, the substrate thus treated is coated electrolytically in a bath that will deposit a metal coating onto the substrate. The two step process of the present invention avoids the use of the electroless metal coating which contains formaldehyde and by eliminating formaldehyde from the process, health and environmental problems are also avoided.

The substrate can be any non-conductive substrate as defined herein, but if the substrate comprises a circuit board, a metal clad circuit board can be employed, e.g., a copper clad circuit board either with or without through-holes or such a circuit board where the metal has been removed by an acid etching process known in the art. Removal of the metal cladding, e.g., copper in this manner leaves sites for subsequent application of a metal coating such as the pattern plating described herein.

Where the substrate comprises a board that has the metal coating removed, it can also be subsequently plated to form a circuit over the entire surface by methods known in the art which is sometimes referred to as panel plating. In comparative experiments it has been found that the process and compositions of the present invention can be employed including the acid neutralizing-reducing bath and microetching steps in panel plating operations to obtain complete coverage of the board whereas by comparison, the Okabayashi and Morrissey processes as described herein which do not employ the acid neutralizing reducing bath do not give full panel plating.

The following examples are illustrative.

EXAMPLE 1

Epoxy glass laminates (FR-4), commonly used for printed circuit boards, are employed as the substrate and comprise copper clad boards with drilled through-holes. The test panels are first stripped of the copper cladding foil by an acid etch, rinsed and dried to obtain bare epoxy-glass substrates.

The panels are then treated with M & T Harshaw CC-301 cleaner conditioner, rinsed and then treated with M & T Harshaw PTC palladium-tin activator, rinsed and treated with the self accelerating and replenishing immersion copper bath of the present invention comprising 20 g/l lithium hydroxide, 15 g/l monoethanolamine and 0.5 g/l cupric chloride in water for 10 minutes at 150° F. The pH of the bath is 12.9. The substrate is then rinsed and treated with neutralizer, e.g., a mild aqueous reducing solution comprising 0.2 m/l $H_2SO_4$ and 0.3 m/l of hydroxylamine sulfate, rinsed and air dried. Treated substrates are then examined for surface resistivity values. Normally they show surface resistivity about 2 k$\Omega$/inch. The surface resistivity is also dependent upon the degree of surface roughness produced by either some physical or chemical surface pretreatment. In such cases, with various degrees of roughness, the resistivity values ranged between about 100$\Omega$ to about 30 k$\Omega$ inch measured. Variation in resistivity values were also observed where different substrate materials are used.

EXAMPLES 2–9

FR-4 epoxy glass laminate are first treated in the same way as described in Example 1 up to the activator step and rinsed, then processed for 10 minutes in different immersion copper baths with different chemical compositions as shown in Table 1 along with the results obtained.

EXAMPLE 10

Following the procedure of Examples 2–9, FR-4 epoxy glass laminates are treated in the same way as described in Example 1 up to the activator step and rinsed then processed for ten minutes in an immersion copper bath comprising 20 g/l LiOH, 0.5 g/l cupric chloride, 15 g/l rochelle salt (potassium sodium tartarate) the copper bath having a pH of 12.0. The resistivity of the coating applied using this composition was 3.5 k$\Omega$/inch and the stability was greater than 100° C., as was the case, for Examples 2–5, 8 and 9.

EXAMPLE 11

Copper-clad epoxy glass FR-4 laminate panels with drilled through-holes are treated by the process described in Example 1 and then electroplated in a conventional acid copper bath containing 75 g/l copper sulfate pentahydrate, 10% by vol. of concn. sulfuric acid and 70 ppm of Cl ions at 20 ASF and 70° F. The plated panels showed good surface finishing, copper-copper adhesion and void-free coverage inside the through-holes.

EXAMPLE 12

The same test panels with similar pretreatment described in Example 10 are electroplated in a copper pyrophosphate plating bath at 120° F., pH 8.3. The bath composition includes copper pyrophosphate 18–30 g/l; $P_2O_7$:Cu 7.4–8.0:1; ammonia as $NH_3$, 0.38–2.25 g/l. The plated panels showed good finishing and coverage on the surface as well as inside the holes.

EXAMPLE 13

Panels of ABS plastic are treated through the process described in Example 1, then electroplated in a conventional acid copper bath described in Example 10. The plated plastic panels showed good void-free coverage with a smooth lustrous finish.

Resistivity values of the substrate thus obtained fall in the range of 0.6–0.7 kΩ/inch.

TABLE 1

| | Concentration g/l | | | | | | | |
|---|---|---|---|---|---|---|---|---|
| | 2 | 3 | 4 | 5 | 6 | 7 | 8 | 9 |
| LiOH | 20 | | 20 | | | 30 | | |
| NaOH | | | | 20 | 100 | | 100 | |
| NaHCO₃ | | | | | 200 | | 150 | |
| MEA | 15 | | 15 | 15 | | | | |
| Gluconic acid | | | | | | 5 | | |
| Lactic acid | | | | | | 20 | | |
| Acetic acid | | | | | | | | |
| Methane Sulfonic Acid | | | | | | | | 40 |
| Cupric chloride | | 10 | 0.5 | 0.5 | 0.5 | 0.2 | 1.0 | 0.5 |
| Lithium chloride | | | | | | 40 | | |
| pH | 12.9 | 3.5 | 12.9 | 12.9 | 12.0 | 11.5 | 12.0 | <1.0 |
| Resistivity kΩ/inch | high* | high* | 2.0 | 4.5 | 12.9 | 3.6 | 21.5 | 860 |
| Stability | >100° C. | >100° C. | >100° C. | >100° C. | 70° C. | 60° C.** | >100° C. | >100° C. |

*Not conductive
**Stable for about 24 hours, solution turns turbid afterwards.

EXAMPLE 14

An epoxy glass laminate (FR-4) substrate material is treated in the same way as described in Example 1, up to the application of the immersion copper coating step, rinsed, treated with a reducing formulation comprising 0.1% dimethylaminoborane (DMAB) and 0.5% boric acid (pH about 6.0) for 3 minutes at 30° C., rinsed and air dried. The treated substrate is then measured for surface resistivity which is about 0.3 kΩ/inch.

EXAMPLE 15

Example 14 is repeated, however, the substrate is treated with a 2% sodium borohydride/4% sodium hydroxide solution for 3 minutes at 30° C. in lieu of DMAB. The substrate is then rinsed and air dried and examined for surface resistivity. Resistivity values fall within the range of 0.2–0.3 kΩ/inch.

EXAMPLE 16

The process of Example 14 is repeated, however the substrate is treated with a 5% sodium sulfite solution for 3 minutes at 40° C. in lieu of DMAB, followed by rinsing. The substrate is then air dried and examined for resistivity. Resistivity values of about 7 kΩ/inch are obtained.

EXAMPLE 17

The process of Example 14 is repeated, however the substrate is treated with a reducing solution comprising a 1% aqueous solution of hydrazine (pH~9.2) for 3 minutes at 80° F. in lieu of DMAB, rinsed and air dried. The treated substrate is then examined for surface resistivity, which is about 0.15 kΩ/inch.

EXAMPLE 18

The process of Example 14 is repeated, however the substrate is treated with a reducing composition comprising 1.0% hydrazine sulfate solution in water (pH 2.0) for 3 minutes at 80° F. in lieu of DMAB, rinsed and dried.

EXAMPLE 19

The process of Example 14 is repeated, however a reducing solution comprising 1% lithium borohydride in water (pH 11.2) is employed in lieu of DMAB and the substrate treated with this reducing solution for 3 minutes at 100° F., after which it is rinsed and air dried. The substrate shows resistivity values in the range of 0.2–0.3 kΩ/inch.

EXAMPLE 20

In a separate experiment, substrates prepared according to Example 1 to 19 with different reducing agents and under different conditions as set forth are then treated with an acidic cleaner, rinsed and then treated with an oxidizing microetching solution. The acidic cleaner is either sulfuric acid or hydrochloric acid mixed with a nonionic surfactant. The oxidizing microetching solution is either a persulfate solution or mixture of hydrogen peroxide with sulfuric acid. After microetching, the substrates are rinsed, air dried and examined for surface resistivity, which is then compared to their initial resistivity prior to a microetching treatment. Increases in the resistivity values (i.e. a drop in conductivity) range between about 2–10 times depending on the reducing conditions. Higher initial resistivity numbers showed a bigger change in that higher final resistivity values are obtained.

Those substrates without any reducing treatment when treated with an acidic cleaner followed by micro-etching show almost a 100% loss in the surface conductivity (resistivity values measured in mega-ohms).

It will be apparent to those skilled in the art that various modifications and variations can be made regarding the process for applying a metal coating to a non-conductive substrate without using an electroless coating and the novel self accelerating and replenishing immersion metal composition of the present invention without departing from the spirit or scope of the invention. It is intended that the present invention cover these modifications and variations, provided that they come within the scope of the appended claims and their equivalents.

What is claimed is:

1. A process for applying a metal coating to a nonconductive substrate comprising:
   a. contacting said substrate with an activator comprising a noble metal/Group IVA metal sol to obtain a treated substrate;
   b. contacting said treated substrate with a self accelerating and replenishing immersion metal composition having a pH above about 11 to about pH 13 comprising a solution of:
      (i) a Cu(II), Ag, Au(III), or Ni soluble metal salt or mixtures thereof,
      (ii) a Group IA metal hydroxide,
      (iii) a complexing agent comprising an organic material having a cumulative formation constant log K of from about 0.73 to about 21.95 for an ion of the metal of said metal salt, to obtain a coated substrate.

2. The process of claim 1 where said Group IVA metal is present in an excess compared to said noble metal and is substantially in its lowest oxidation state.

3. The process of claim 2 where said excess of said Group IVA metal comprises said Group IVA metal substantially in its lowest oxidation state.

4. The process of claim 3 where the molar ratio of said Group IVA metal to said noble metal is from about 10:1 to about 55:1.

5. The process of claim 3 wherein said Group IVA metal comprises tin and said soluble metal salt comprises a salt of Cu(II).

6. The process of claim 3 wherein said Group IVA metal comprises tin and said soluble metal salt comprises a salt of Ag.

7. The process of claim 3 wherein said Group IVA metal comprises tin and said soluble metal salt comprises a salt of Au(III).

8. The process of claim 3 wherein said Group IVA metal comprises tin and said soluble metal salt comprises a salt of Ni.

9. The process of claim 2 where the molar ratio of said Group IVA metal to said noble metal is from about 4:1 to about 95:1.

10. The process of claim 2 wherein said activator comprises a palladium-tin sol.

11. The process of claim 10 where said complexing agent is an aliphatic amine, cyclic amine, carboxylic acid or amino acid having up to about 8 to about 10 carbon atoms.

12. The process of claim 10 wherein said complexing agent is a lower alkanolamine, gluconic acid, lactic acid, acetic acid, and tartaric acid or their salts.

13. The process of claim 12 wherein said complexing agent is monoethanolamine or tartaric acid or their salts, said Group IA metal hydroxide is lithium hydroxide and wherein said metal is copper.

14. The process of claim 9 wherein said substrate has a copper layer on one of its surfaces.

15. The process of any one of claims 6, 8 or 9 comprising:
   a. contacting said coated substrate with an acidic neutralizing and reducing solution based on an acid and a salt of an inorganic or organic amine to obtain a neutralized substrate;
   b. microetching said neutralized substrate to obtain an etched substrate; and
   c. electrolytically coating a metal onto said etched substrate to obtain an electrolytically coated substrate.

16. The process of claim 15 where said salt comprises a salt of hydroxyl amine or hydrazine, said acid comprises a mineral acid and said metal coated onto said etched substrate comprises a Group IB metal or nickel.

17. The process of claim 16 further comprising forming a circuit pattern on said electrolytically coated substrate.

18. The process of claim 15 further comprising forming a circuit pattern on said electrolytically coated substrate.

19. The process of any one of claims 1, 2, 10, 12 or 13 wherein said substrate has a Group IB metal layer on one of its surfaces.

20. The process of any one of claims 1, 2, 10, 12 or 13 wherein said substrate is a circuit board having through-holes, said metal coating being applied at least to the walls of said through-holes.

21. The process of claim 20 wherein said circuit board, before applying said metal coating, has a Group IB metal on one of its surfaces other than the walls of said through-holes.

22. The process of claim 20 wherein said circuit board, before applying said metal coating, has copper on one of its surfaces other than the walls of said through-holes.

23. The process of any one of claims 1, 2 or 10, further comprising contacting said coated substrate with a reducing agent to obtain a reduced metal coating on said substrate and electrolytically coating a metal onto said reduced metal coating to obtain an electrolytically coated substrate.

24. The process of claim 23, wherein said coated substrate is neutralized prior to or simultaneously with the step of contacting said coated substrate with a reducing solution.

25. The process of claim 23, wherein said reduced metal coating is microetched prior to said step of electrolytically coating said reduced metal.

26. The process of claim 23, wherein said reducing agent is a hydroxylamine or a derivative thereof, hydrazine or a derivative thereof, a borohydride or a lower alkyl amino borane.

27. In a process for applying a metal coating to a non-conductive substrate without employing a formaldehyde containing electroless coating composition the improvement comprising a two-step coating process, the first step comprising increasing the conductivity of said substrate by:
   b. contacting said substrate with an activator comprising a noble metal/Group IVA metal sol to obtain a treated substrate;
   b. contacting said treated substrate with a self accelerating and replenishing immersion metal composition having a pH from above about 11 to about 13 comprising a solution of:
      (i) a Cu(II), Ag, Au(III) or Ni soluble metal salt or mixtures thereof,
      (ii) a Group IA metal hydroxide,
      (iii) a complexing agent comprising an organic material having a cumulative formation constant log K of from about 0.73 to about 21.95 for an ion of the metal of said metal salt, to obtain a coated substrate, the second step comprising electrolytically coating a metal onto said coated substrate.

28. The process of claim 27 where said Group IVA metal is present in an excess compared to said noble metal and is substantially in its lowest oxidation state.

29. The process of claim 28 where said excess of said Group IVA metal comprises said Group IVA metal substantially in its lowest oxidation state.

30. The process of claim 29 wherein said Group IVA metal comprises tin and said soluble metal salt comprises a salt of Cu(II).

31. The process of claim 29 wherein said Group IVA metal comprises tin and said soluble metal salt comprises a salt of Ag.

32. The process of claim 29 wherein said Group IVA metal comprises tin and said soluble metal salt comprises a salt of Au(III).

33. The process of claim 29 wherein said Group IVA metal comprises tin and said soluble metal salt comprises a salt of Ni.

34. The process of claim 29 where the molar ratio of said Group IVA metal to said noble metal is from about 10:1 to about 55:1.

35. The process of claim 28 where the molar ratio of said Group IVA metal to said noble metal is from about 4:1 to about 95:1.

36. The process of claim 29 wherein said activator comprises a palladium-tin sol.

37. The process of claim 36 where said complexing agent is an aliphatic amine, cyclic amine, carboxylic acid or amino acid having up to about 8 to about 10 carbon atoms.

38. The process of claim 36 wherein said complexing agent is a lower alkanolamine, gluconic acid, lactic acid, acetic acid and tartaric acid or their salts.

39. The process of claim 38 wherein said complexing agent is monoethanolamine or tartaric acid or their salts, said Group IA metal hydroxide is lithium hydroxide and wherein said metal is copper.

40. The process of any one of claims 36, 38 or 39 wherein said non-conductive substrate has a Group IB metal layer on one of its surfaces which is removed by etching prior to contacting said substrate with said activator.

41. The process of claim 40 wherein said Group IB metal layer is a copper layer.

42. The process of claim 40 comprising:
   a. contacting the said coated substrate with an acidic neutralizing and reducing solution based on an acid and a salt of an inorganic or organic nitrogen compound to obtain a neutralized substrate;
   b. microetching said neutralized substrate to obtain an etched substrate; and
   c. electrolytically coating a metal onto said etched substrate to obtain an electrolytically coated substrate.

43. The process of claim 42 where said salt comprises a salt of hydroxyl amine or hydrazine, said acid comprises a mineral acid and said metal coated onto said etched substrate comprises copper.

44. The process of claim 42 further comprising forming a circuit pattern on said electrolytically coated substrate.

45. The process of claim 43 further comprising forming a circuit pattern on said electrolytically coated substrate.

46. A process for applying a metal coating to a nonconductive substrate comprising:
   c. contacting said substrate with an activator comprising a noble metal/Group IVA metal sol to obtain a treated substrate;
   b. contacting said treated substrate with a self accelerating and replenishing immersion metal composition comprising a solution of;
      (i) a soluble metal salt whose metal is more noble than said Group IVA metal,
      (ii) a Group IA metal hydroxide,
      (iii) a complexing agent comprising an organic material having a cumulative formation constant log K of from about 0.73 to about 21.95 for an ion of the metal of said metal salt, to obtain a coated substrate;
   c. contacting said coated substrate with a reducing agent to obtain a reduced metal coating on said substrate, and;
   d. electrolytically coating a metal onto said reduced metal coating to obtain an electrolytically coated substrate.

47. The process of claim 46, wherein said coated substrate is neutralized prior to or simultaneously with the step of contacting said coated substrate with a reducing solution.

48. The process of claim 46, wherein said reduced metal coating is microetched prior to said step of electrolytically coating said reduced metal.

49. The process of claim 46, wherein said reducing agent is a hydroxylamine or a derivative thereof, hydrazine or a derivative thereof, a borohydride or a lower alkyl amino borane.

50. The process of claim 46 where said Group IVA metal is present in excess compared to said noble metal.

51. The process of claim 46 where said excess of said Group IVA metal comprises said Group IVA metal substantially in its lowest oxidation state.

52. The process of claim 51 wherein said activator comprises a palladium-tin sol and said soluble metal salt is based on a metal wherein said metal is a Group IB metal or nickel.

53. The process of claim 52 where said complexing agent is an aliphatic amine, cyclic amine, carboxylic acid or amino acid having up to about 8 to about 10 carbon atoms.

54. The process of claim 52 wherein said complexing agent is a lower alkanolamine, gluconic acid, lactic acid, acetic acid, and tartaric acid or their salts.

55. The process of claim 54 wherein said complexing agent is monoethanolamine or tartaric acid and their salts, said Group IA metal hydroxide is lithium hydroxide and wherein said metal is copper.

56. The process of claim 51 wherein said Group IVA metal comprises tin and said soluble metal salt comprises a salt of Cu(II).

57. The process of claim 51 wherein said Group IVA metal comprises tin and said soluble metal salt comprises a salt of Ag.

58. The process of claim 51 wherein said Group IVA metal comprises tin and said soluble metal salt comprises a salt of Au(III).

59. The process of claim 51 wherein said Group IVA metal comprises tin and said soluble metal salt comprises a salt of Ni.

60. The process of claim 46 where the molar ratio of said Group IVA metal to said noble metal is from about 4:1 to about 95:1.

61. The process of claim 46 where the molar ratio of said Group IVA metal to said noble metal is from about 10:1 to about 55:1.

62. The process of any one of claims 46, 47, or 52, wherein said substrate has a Group IB metal layer on one of its surfaces.

63. The process of claim 62 wherein said substrate has a copper layer on one of its surfaces.

64. The process of any one of claims 46, 47, or 52 comprising:
   a. contacting said coated substrate with an acidic neutralizing and reducing solution based on an acid and a salt of an inorganic or organic amine to obtain a neutralized substrate;
   b. microetching said neutralized substrate to obtain an etched substrate; and
   c. electrolytically coating a metal onto said etched substrate to obtain an electrolytically coated substrate.

65. The process of claim 64 where said salt comprises a salt of hydroxyl amine or hydrazine, said acid comprises a mineral acid and said metal coated onto said etched substrate comprises a Group IB metal or nickel.

66. The process of claim 65 further comprising forming a circuit pattern on said electrolytically coated substrate.

67. The process of claim 64 further comprising forming a circuit pattern on said electrolytically coated substrate.

68. The process of claim 64 wherein said substrate has a Group IB metal layer on one of its surfaces.

69. The process of claim 68 wherein said substrate has a copper layer on one of its surfaces.

70. The process of claim 64 wherein said substrate is a circuit board having through-holes, said metal coating being applied at least to the walls of said through-holes.

71. The process of claim 70 wherein said circuit board, before applying said metal coating, has a Group IB metal on one of its surfaces other than the walls of said through-holes.

72. The process of claim 71 wherein said circuit board, before applying said metal coating, has copper on one of its surfaces other than the walls of said through-holes.

73. The process of any one of claims 46, 47, 52, 54 or 55 wherein said substrate is a circuit board having through-holes, said metal coating being applied at least to the walls of said through-holes.

74. The process of claim 73 wherein said circuit board, before applying said metal coating, has a Group IB metal on one of its surfaces other than the walls of said through-holes.

75. The process of claim 73 wherein said circuit board, before applying said metal coating, has copper on one of its surfaces other than the walls of said through-holes.

* * * * *

UNITED STATES PATENT AND TRADEMARK OFFICE
CERTIFICATE OF CORRECTION

PATENT NO. : 5,543,182
DATED : August 6, 1996
INVENTOR(S) : JOSHI et al.

It is certified that error appears in the above-indentified patent and that said Letters Patent is hereby corrected as shown below:

Claim 1,   col. 19,  line 10, "of;" should read --of:--.

Claim 14,  col. 19,  line 54, "claim 9" should read --claim 13--.

Claim 15,  col. 19,  line 56, "claims 6, 8 or 9" should read --claims 10, 12 or --13--.

Claim 27,  col. 20,  line 40, "b." should read --a.--;
                     line 46, "of;" should read --of:--.

Claim 36,  col. 21,  line 13, "claim 29" should read --claim 28--.

Claim 46,  col. 21,  line 50, "c." should read --a.--;
                     line 55, "of;" should read --of:--;
                     line 65, "substrate, and;" should read --substrate; and--.

Claim 67,  col. 23,  line 1, "claim 64" should read --claim 65--.

Signed and Sealed this

Twenty-first Day of January, 1997

Attest:

BRUCE LEHMAN

*Attesting Officer*  *Commissioner of Patents and Trademarks*